United States Patent [19]

O'Leary et al.

[11] Patent Number: 5,381,110
[45] Date of Patent: Jan. 10, 1995

[54] SPURIOUS FREQUENCY SUPPRESSOR

[75] Inventors: Thomas M. O'Leary, Dracut; Peter R. Drake, Southborough, both of Mass.; Philip R. Merrill, deceased, late of Nashua, N.H., by Jerilyn L. Merrill, administratrix

[73] Assignee: Raytheon Company, Lexington, Mass.

[21] Appl. No.: 19,324

[22] Filed: Feb. 10, 1993

Related U.S. Application Data

[63] Continuation of Ser. No. 812,504, Dec. 20, 1991, abandoned.

[51] Int. Cl.$^6$ ............................................. H03F 1/32
[52] U.S. Cl. ..................................... 330/149; 330/284
[58] Field of Search ............... 330/149, 284, 144, 145; 455/63; 307/542; 328/165

[56] References Cited

U.S. PATENT DOCUMENTS

| | | | |
|---|---|---|---|
| 4,320,399 | 3/1992 | Buck et al. | 343/17.1 R |
| 4,379,996 | 4/1983 | Weber | 330/296 |
| 4,588,958 | 5/1986 | Katz et al. | 330/149 |
| 4,928,072 | 5/1990 | Scott | 330/149 |

FOREIGN PATENT DOCUMENTS 2018854 6/1990 Canada .

Primary Examiner—Robert J. Pascal
Assistant Examiner—Tan Dinh
Attorney, Agent, or Firm—Walter F. Dawson

[57] ABSTRACT

Spurious frequencies are suppressed in a transmitter by an RF pulse fall time controller circuit comprising a quadrature hybrid matched attenuator located between a predriver and the first stage of class "C" driver amplifiers. The circuit linearly attenuates RF pulses and slows pulse fall time. Operation of the circuit is initiated when the rising edge of a pretrigger starts a pretrigger generator which then triggers the application of current bias to the attenuator circuit. After a controlled period of time, the circuit decreases the forward current bias of PIN diodes in the attenuator thereby increasing the diodes' series resistance and increasing the attenuation of the RF pulses. This creates a slow pulse fall time thereby suppressing spurious emissions caused by parasitic ringing of the cascaded Class C common base transistor amplifiers in the transmitter.

13 Claims, 5 Drawing Sheets

SPURIOUS FREQUENCY SUPPRESSOR

This application is a continuation of application Ser. No. 07/812,504 filed Dec. 20, 1991 and now abandoned.

BACKGROUND OF THE INVENTION

This invention relates generally to Class C common base transistor amplifiers of a solid state transmitter and in particular to an apparatus and method for controlling spurious frequency components of a radio frequency (RF) pulse output from the transmitter.

The suppression of spurious frequency components in cascaded Class C common base transistor amplifiers is described in U.S. Pat. No. 4,928,072, issued May 22, 1990, to John C. Scott and assigned to the present assignee. The circuit described in this patent comprises a capacitor and shunt diode in series between an emitter and ground of each Class C amplifier stage to slow the pulse fall time and thereby eliminate spurious frequencies resulting from parasitic ringing.

The Class C common base amplifier is the most widely used configuration for power stages of radio frequency (RF) signals, particularly from UHF to S band. It is more efficient than other modes of operation (Class A, Class AB, etc.) and provides higher gain and better stability than its common emitter counterpart. An illustrative Class C common base transistor amplifier comprises an NPN transistor having its emitter electrode as an input terminal, its collector electrode as an output terminal, and its base electrode coupled to a reference voltage, typically ground. In this configuration, the collector electrode is biased positively with respect to the emitter electrode.

The operation of this amplifier is described in Scott as follows: during the negative half cycle of the input signal, the base-emitter junction is forward biased. After the negative voltage surpasses the base-emitter voltage drop, the transistor turns on and draws collector current. This current forms the negative half cycle of the output signal. During the positive half cycle of the input signal, the base-emitter junction is reverse biased, and the transistor is turned off. During this time, energy stored in the transistor collector circuit is dissipated in the load to form the positive half cycle of the output signal. Because the transistor is conducting for less than 180 degrees of the RF cycle, this is a very efficient mode of operation. Unfortunately, it is also the mode that produces the worst output spectrum.

During normal operation of a Class C common base amplifier, the current flowing out of the emitter will have a small dc component due to the self bias of the base-emitter junction. This dc component flows through the emitter bias return to ground, whenever the RF signal is present at the transistor input. Because the emitter bias return has a certain amount of inherent inductance, energy will be stored during the RF pulse. At the end of the RF pulse, this energy discharges through the transistor input terminals. This inductive discharge injects holes into the transistor base region, and thereby keeps the transistor on for a period determined by the time constant of the inductance and the input parasitics of the transistor.

Because the transistor is biased on during this transient period, any positive feedback path that exists is allowed to produce spurious oscillations or ringing. These oscillations appear in the output spectrum as spurious frequency components. These frequency components appear as relatively wide peaks in the skirt of the output spectrum profile, as may be seen in FIG. 5. As shown, the amplitudes of many of these components may exceed acceptable levels as typically specified for use in high power radar transmitters. As an example, most high power radar systems in use today require all spurious components to be from 70 to 90 decibels below the carrier frequency amplitude (dBc) in a one kilohertz bandwidth.

A solid state transmitter in high power radar systems uses hundreds or thousands of Class C transistor amplifiers in the output stages, thereby requiring hundreds or thousands of Scott's spurious frequency suppressor circuits. This results in considerable additional electronics affecting size, weight, power, cost and reliability of the radar system.

SUMMARY OF THE INVENTION

Accordingly, it is therefore an object of this invention to suppress spurious frequencies generated in amplifier means of a transmitting device such as a radar system transmitter.

It is a further object of this invention to suppress spurious frequencies of a transmitter using minimal additional electronic hardware.

It is a further object of this invention to provide a method of suppressing spurious frequencies by controlling the fall time of RF pulses coupled to amplifier means.

These and other objects are met by a combination including a source of RF pulses, means for amplifying the RF pulses, and means coupled between the source of the RF pulses and the RF amplifying means for suppressing spurious frequencies generated in the amplifying means. The spurious frequencies suppressing means further comprises means for controlling the fall time of the RF pulses.

The objects are further accomplished by a spurious frequency suppressor comprising a directional coupler having four ports, a first port being an input port and a second port being an output port, the input port of the directional coupler being provided with an RF input pulse, means coupled to a third port and a fourth port of the directional coupler for attenuating the RF input pulse in accordance with a control signal, and means coupled to the attenuating means for generating the control signal. The directional coupler comprises a 3 dB 90° hybrid. The attenuating means comprises a PIN diode network means for controlling the amount of attenuation of the RF input pulse in accordance with the control signal. The PIN diode network means changes the fall time of the RF input pulse in accordance with the control signal. The control signal generating means comprises pulse shaping means for generating a bias current for the PIN diode network means. The pulse shaping means comprises means for adjusting the pulse width of a trigger signal in response to a pre-trigger input signal, means coupled to the adjusting means for generating a voltage ramp signal, and means coupled to the voltage ramp signal generating means for generating the bias current for the PIN diode network means.

The objects are further accomplished by a method of suppressing spurious frequencies in a transmitter comprising the steps of providing a source of RF pulses, amplifying the RF pulses with amplifying means, and suppressing the spurious frequencies generated in the amplifying means by coupling a suppressing means between the source of RF pulses and the amplifying means. The step of suppressing spurious frequencies comprises the step of controlling the fall time of the RF pulses.

The objects are further accomplished by a method of suppressing spurious frequencies comprising the steps of providing an RF input pulse to a directional coupler having four ports, a first port being an input port and a second port being an output port, attenuating the RF input pulse with means coupled to a third port and a fourth port of the directional coupler in accordance with a control signal, and generating the control signal with means coupled to the attenuating means. The step of attenuating the RF input pulse comprises the step of providing a PIN diode network means for controlling the amount of attenuation of the RF input pulse in accordance with the control signal. The step of providing the PIN diode network means for controlling the amount of attenuation further comprises the step of changing the fall time of the RF input pulse in accordance with the control signal. The step of generating the control signal comprises the step of using pulse shaping means for generating a bias current for the PIN diode network means. The step of generating the bias current with the pulse shaping means comprises the steps of adjusting the pulse width of a trigger signal in response to a pretrigger input signal, generating a voltage ramp signal in response to the trigger signal, and generating the bias current for the PIN diode network means with current source means coupled to the voltage ramp signal generating means.

BRIEF DESCRIPTION OF THE DRAWINGS

Other and further features and advantages of the invention will become apparent in connection with the accompanying drawings wherein.

DESCRIPTION OF THE PREFERRED EMBODIMENT

Figure 1:
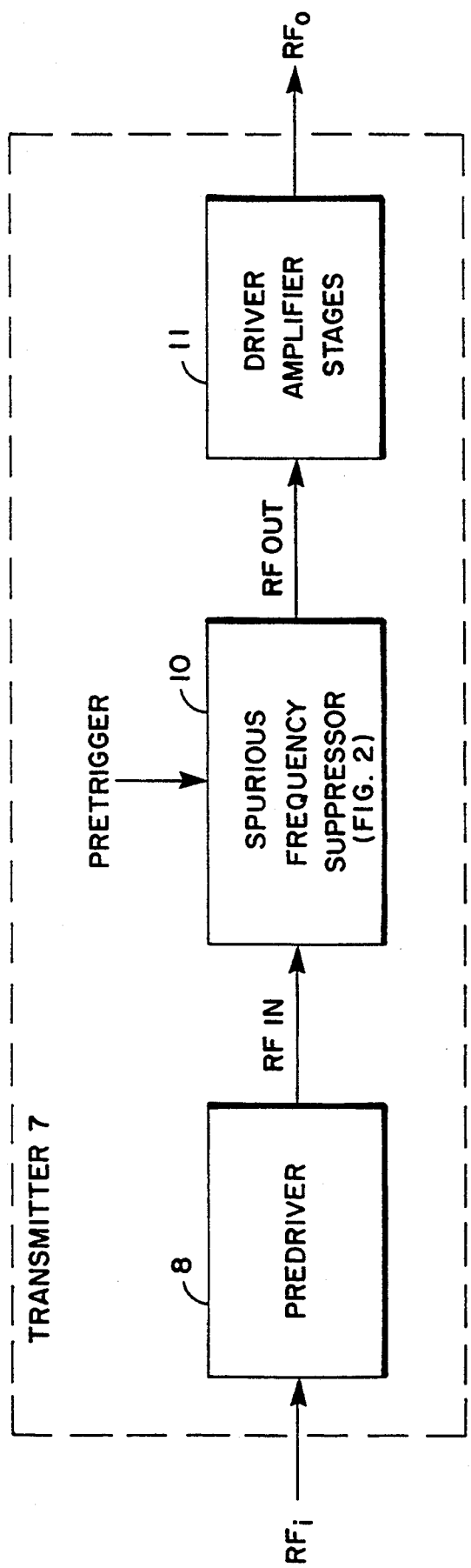
FIG. 1 is a simplified block diagram of a transmitter including a spurious frequency suppressor of the present invention.

Referring to FIG. 1, a simplified block diagram is shown of a transmitter 7 comprising a predriver 8, a spurious frequency suppressor 10 and driver amplifier stages 11. A radio frequency ($RF_i$) signal is fed to the predriver 8 for amplifying $RF_i$ and the predriver output, RF IN, is fed to the spurious frequency suppressor 10 for generating a controlled RF OUT signal. The RF OUT signal is fed to the driver amplifier stages 11 where spurious spectra are generated. However, the spurious frequency suppressor 10 located in the front end of the transmitter 7 controls the RF waveform to prevent generation of spurious spectra in the driver amplifier stages 11.

Figure 2:
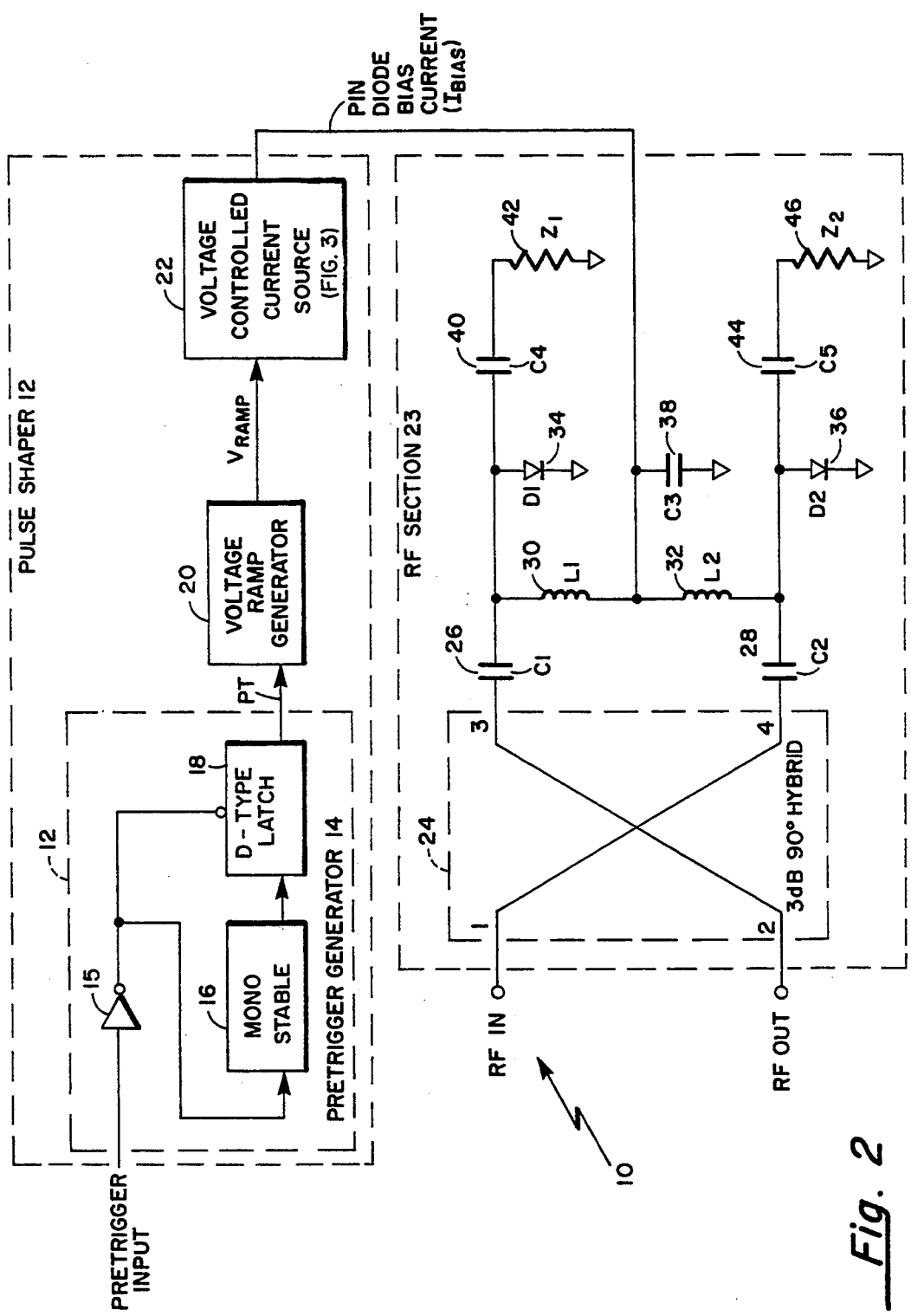
FIG. 2 is a combination block diagram and schematic of spurious frequency suppressor circuitry of the present invention.

Referring to FIG. 2, a diagram of the spurious frequency suppressor 10 is shown which suppresses or controls the spurious frequencies typically generated in Class C amplifiers of a solid state transmitter 7, for example, in a radar system. Suppressing the spurious frequencies is accomplished by controlling the fall time of the RF pulse (RF OUT) that is fed to the driver amplifier stages 11. The spurious frequency suppressor 10 comprises a pulse shaper 12 for generating a PIN diode bias current ($I_{BIAS}$). The PIN diode bias current ($I_{BIAS}$) is fed to PIN diodes 34, 36 in the RF section 23 circuitry. Controlling the bias current through the PIN diodes 34, 36 controls the RF attenuation; hence, the RF pulse shape is controlled directly by the PIN diode bias current ($I_{BIAS}$).

The RF section 23 is a quadrature hybrid matched attenuator with shunt connected PIN diodes 34, 36. It includes a 3 dB, 90° hybrid comprising ports 1, 2, 3 and 4. Ports 3 and 4 are coupled to the shunt connected PIN diodes D1 34 and D2 36 via DC blocking capacitors C1 26 and C2 28 respectively. Series inductors L1 30 and L2 32 isolate the RF from the bias signal input ($I_{BIAS}$) and they are connected across the junction of C1 26 and D1 34 and C2 28 and D2 36 respectively. The PIN diode bias current ($I_{BIAS}$) is fed to the RF section 23 at the junction of L1 and L2. A capacitor C3 38 is connected to the L1 and L2 $I_{BIAS}$ junction point for filtering out RF signals on the DC line. Load network $Z_1$ 42 is connected in series with DC blocking capacitor C4 which is connected to D1 34, and load network $Z_2$ 46 is connected in series with DC blocking capacitor C5 44 which is connected to D2 36.

Still referring to FIG. 2, an RF IN signal enters the 3 dB, 90° Hybrid 24 at port 1. The amplitude of the signal is split equally and exits at port 3 and port 4 with the phase of the signal at port 4 lagging by 90°. If the diodes D1 34 and D2 36 are heavily forward biased, they have a very low series resistance, Rs is approximately zero ohms, and behave as a short circuit. In this short circuit state all of the RF signal from the 3 dB 90° hybrid 24 is reflected off the diodes and applied back to ports 3 and 4 of the 3 dB 90° hybrid 24. These two reflected signals add in phase and exit at port 2 as the RF OUT signal. At port 1 such reflected signals are 180° out of phase and fully cancel out. Under ideal conditions of a lossless, reciprocal system, the signal power at the RF OUT port would equal the power at the RF IN port. If the diodes D1 34 and D2 36 are biased with very low current, e.g. $R_S > 1000$ ohms, they emulate an open circuit. Under this condition all of the RF signal is dissipated in the loads $Z_1$ 42 and $Z_2$ 46. If the bias to the diodes is varied and thus Rs is varied, the diodes will be operating in between the ideal short circuit state and the ideal open circuit state. Such operation allows a percentage of the RF signal to be reflected while the remaining signal power is dissipated in the loads $Z_1$ 42 and $Z_2$ 46. Therefore, the amplitude of the reflected signal and the RF OUT signal is lower than the RF IN signal. By selecting the appropriate PIN diode bias current ($I_{BIAS}$) to the diodes D1 and D2, a wide range of attenuation levels are possible. Controlling the shape of the bias current ($I_{BIAS}$) allows control of the RF output signal (RF OUT) amplitude resulting in pulse shaping by the method of RF signal attenuation.

Still referring to FIG. 2, the pulse shaper 12 comprises a pretrigger generator 14, a voltage ramp generator 20 and a voltage controlled current source 22 which generates the PIN diode bias current ($I_{BIAS}$). A pretrigger input signal to the pretrigger generator causes a PT signal to be generated, the rising edge of which starts the voltage ramp generator 20. The $V_{RAMP}$ signal from the voltage ramp generator 20 is coupled to the voltage controlled current source 22 which generates the $I_{BIAS}$ signal for the PIN diodes 34, 36. The monostable 16 in the pretrigger generator 14 controls the current bias ($I_{BIAS}$) pulse width to the PIN diodes 34, 36. The falling edge of the $I_{BIAS}$ results in an increase in the series resistance ($R_s$) across the PIN diodes 34, 36, which increases the attenuation and controls the fall time of the RF pulse (RF OUT). The RF section 23 of the spurious frequency suppressor 10 utilizes the current controlled resistance characteristics of the PIN diodes 34, 36 at their low loss state (i.e. $R_S$ being very small) and at in between finite resistance values. The attenuation (A) as a function of PIN diodes 34, 36 series resistance ($R_S$) is determined by the expression $$A = 20 \log (1 + 2R_S/Z_o)^{-1} \text{ dB}$$

where $Z_0 = Z_1 = Z_2$.

Table 1 shows the relationship between the series resistance ($R_s$), forward current ($I_{BIAS}$), forward voltage $V_f$), and attenuation (A) of a shunt connected PIN diode such as Model No. MA4P604-131 manufactured by M/A-COM of Burlington, Mass., used for PIN diodes 34, 36 in the present embodiment RF section 23. This M/A-COM PIN diode is a silicon chip diode with a maximum junction capacitance of 0.30 pF at 100 V. The thermal resistance of such diode is 15° C./W.

TABLE 1

| Rs (Ω) | $I_{BIAS}$ (mA) | $V_f$(V) | A (dB) |
|---|---|---|---|
| 0.5 | 100 | 0.92 | 0.2 |
| 5 | 3 | 0.68 | 1.58 |
| 10 | 1 | 0.62 | 2.92 |
| 50 | 0.30 | 0.52 | 9.54 |
| 100 | 0.10 | 0.48 | 13.97 |
| 500 | 0.02 | 0.40 | 26.44 |
| 1000 | 0.01 | 0.36 | 32.25 |

The pulse shaper 12 decreases the forward current diode bias from 100 ma to 0.3 ma over a 2 microsecond nominal window at the end of the RF pulse to provide an attenuation slope of 0 dB to 10 dB. This effectively slows the fall time of the RF pulse to 2 microseconds nominal and suppresses the spurious frequencies at the transmitter 7 output ($RF_o$).

Figure 3:
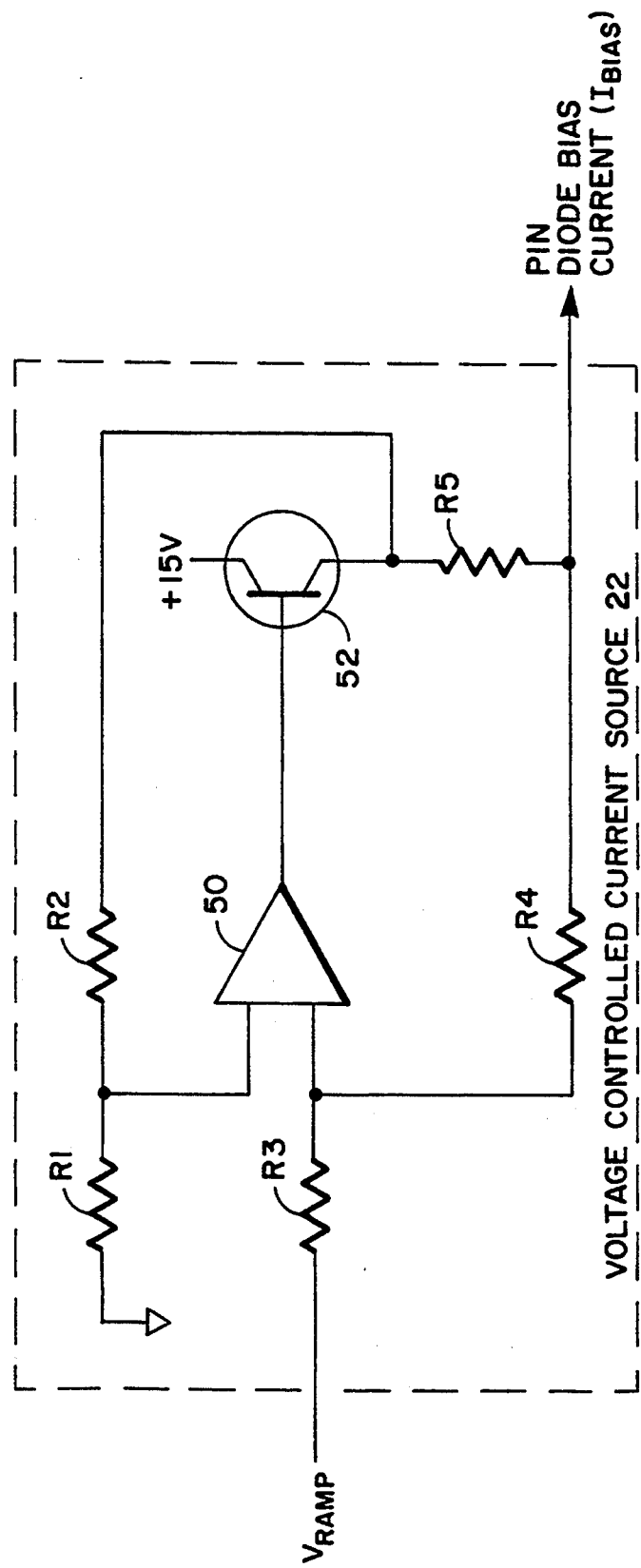
FIG. 3 is a schematic diagram of the voltage controlled current source shown in FIG. 2.

Referring now to FIG. 3, a schematic diagram of the voltage controlled current source 22 is shown comprising an amplifier 50 coupled to the base of transistor 52 forming a current source for generating the voltage controlled $I_{BIAS}$. This circuit known to one skilled in the art is capable of driving a grounded load, and its output is independent of load impedance provided R2=R4, R1=R3 and R2≧100 R5. Under these conditions $$I_{BIAS} = V_{RAMP}\{R2/(R1 \times R5)\}$$

In the present embodiment $I_{BIAS}$=50.27 ma per volt. When the output of the voltage ramp generator 20 is 4.3 volts, the total PIN diode bias current ($I_{BIAS}$) is typically 216.2 ma or 108.1 ma per diode.

Figure 4:
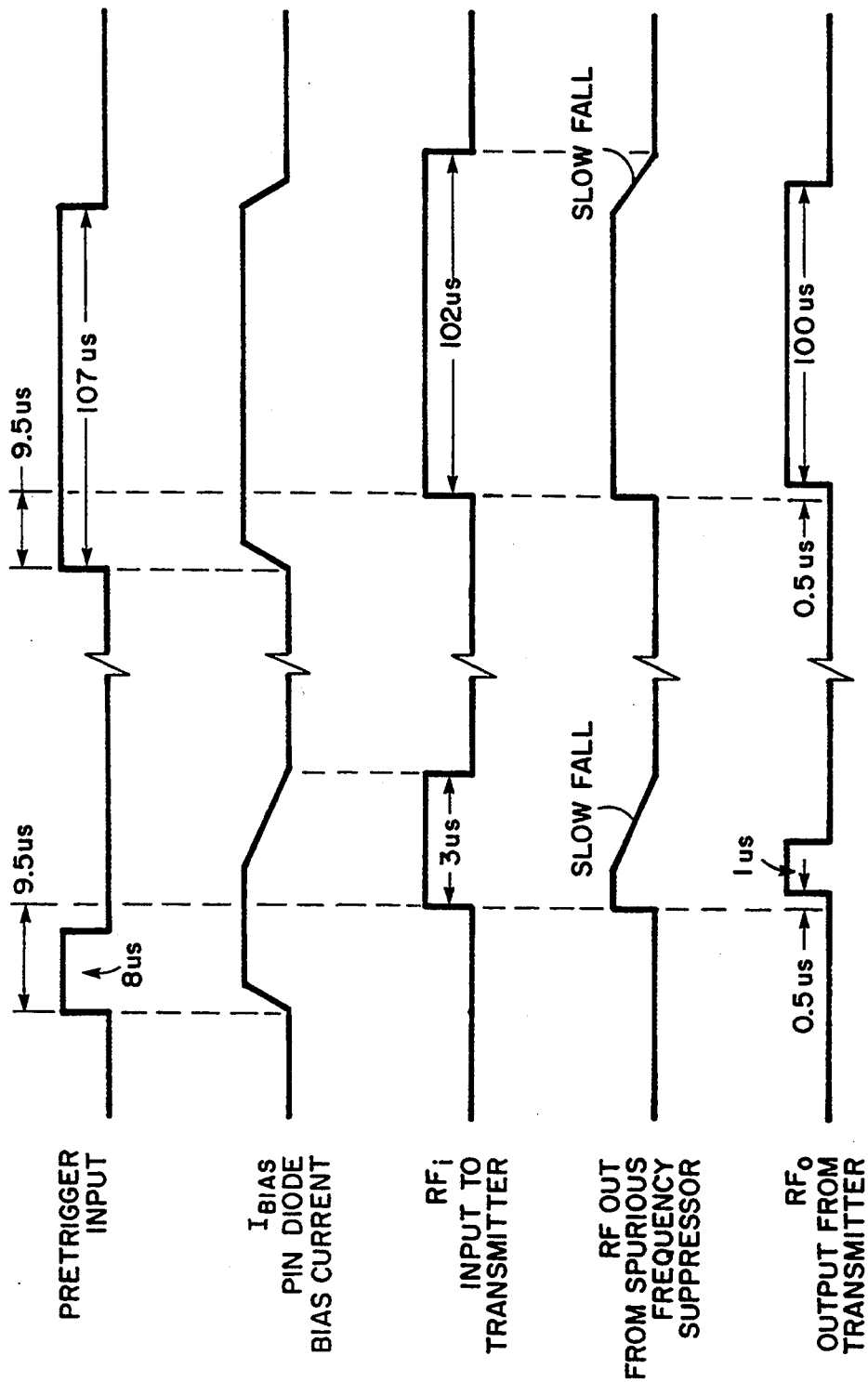
FIG. 4 is a timing diagram useful in understanding the present invention.

Referring now to FIG. 4, a timing diagram is shown which is useful in understanding the invention. In the transmitter 7 of the present embodiment shown in FIG. 1, $RF_o$ output pulse widths of both one microsecond and 100 microsecond are transmitted based on a particular radar system application. However, other pulse widths are equally feasible depending on radar system requirements. The pretrigger input to the pretrigger generator 14 of the pulse shaper 12 occurs 9.5 μsec before the $RF_i$ input pulses to the transmitter 7 to set up current bias $I_{BIAS}$ timing in the pulse shaper 12. The $RF_i$ input pulses provided to the transmitter 7 are 3 microseconds and 102 microseconds respectively as shown in FIG. 4. The $RF_i$ pulse widths input to the transmitter 7 are two microseconds longer than the required $RF_o$ output pulse widths so that the spurious frequency suppressor 10 may create a 2 microsecond fall time on the RF OUT pulses. This slow fall time eliminates the spurious spectra at the $RF_o$ output of the transmitter 7. The PIN diode current bias, $I_{BIAS}$, output of the pulse shaper 12 is activated by the start of the pretrigger input which generates the PT signal. $I_{BIAS}$ ramps up to full amplitude for a controlled pulse width. The current bias, $I_{BIAS}$, then decreases linearly to zero milliamps in 2 microseconds. The pulse width and slope of the current ramp are controlled by the pretrigger generator 14, voltage ramp generator 20, and voltage controlled current source 22 of the pulse shaper 12. Both pulse width and slope of the current ramp are adjustable so that the spurious frequency suppressor 10 may be used with many different RF pulse widths and in applications with other system parameters. The RF OUT pulse from the spurious frequency suppressor 10 shows the one microsecond and 100 microsecond pulses along with a slow fall time of 2 microseconds. Note that when the PIN diode bias current, $I_{BIAS}$, is decreased, the attenuation is increased, thus creating the slow fall time. This results in uncorrupted $RF_o$ output pulses from the transmitter 7 after several amplifier stages 11 of Class C amplification. The $RF_o$ output pulses are 1 microsecond and 100 microseconds long with fast fall times. Note that the $RF_o$ output pulses from the transmitter 7 are delayed by a period of time, which in this embodiment is 0.5 microseconds as shown in FIG. 4. This delay occurs because each Class "C" driver amplifier stage 11 turns on in succession and correspondingly the pulse widths are shortened and the rise and fall times become faster as is the case of the Scott invention (U.S. Pat. No. 4,928,072). In other transmitter application embodiments there may be many more cascaded amplification stages whereby it may be desirable to add another spurious frequency suppressor 10 within the cascaded chain of such amplification stages.

Figure 5:
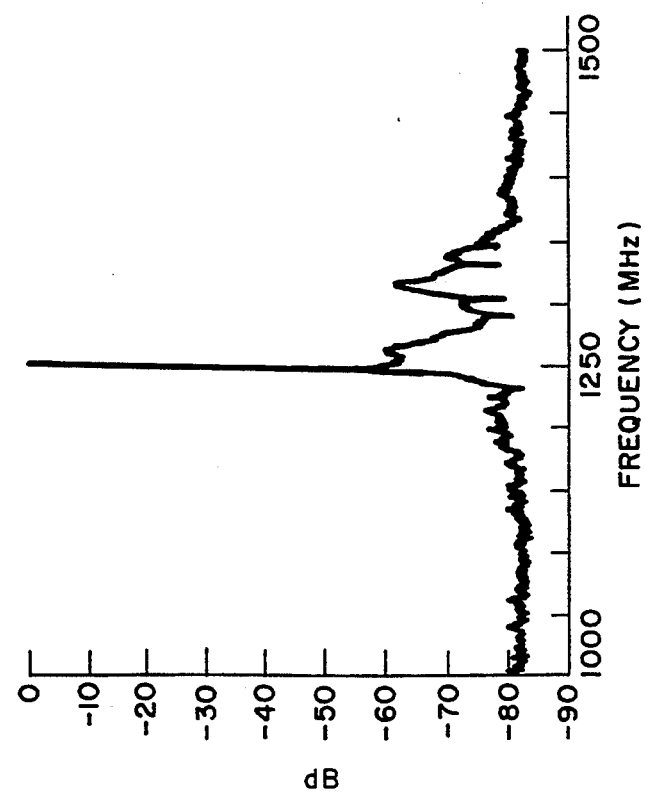
FIG. 5 illustrates the frequency spectrum of a radar transmitter $RF_o$ output shown in FIG. 1 without a spurious frequency suppressor circuit.

Referring now to FIG. 5, the frequency spectrum of a radar transmitter output, $RF_o$, is shown without the use of a spurious frequency suppressor 10. Spurious oscillations are observed in the frequency spectrum at 60 dB below the carrier frequency amplitude. As noted previously in the Background section, most high power radar systems in use today require all spurious components to be from 70 to 90 decibels below the carrier frequency amplitude (dBc) in a one kilohertz bandwidth.

Figure 6:
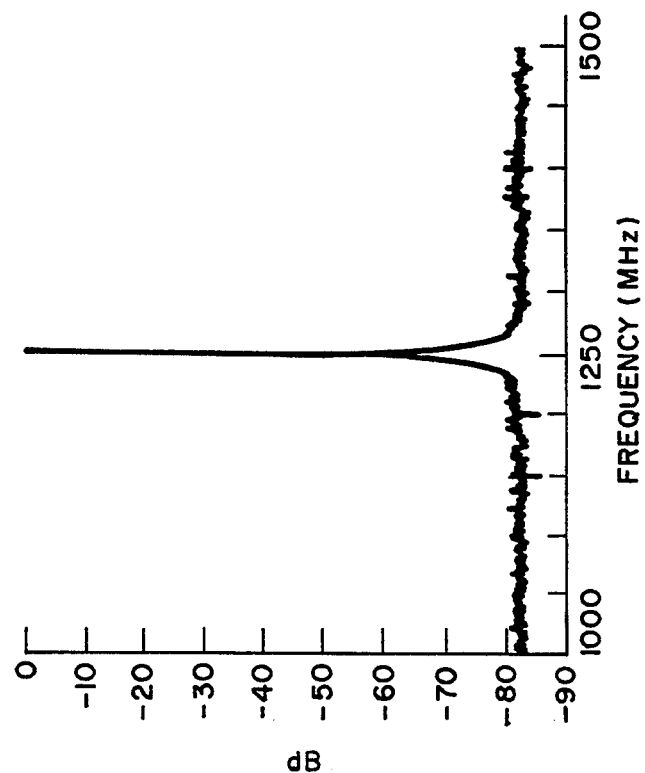
FIG. 6 illustrates the frequency spectrum of a radar transmitter $RF_o$ output shown in FIG. 1 when the transmitter uses the present invention of a spurious frequency suppressor circuit.

Referring to FIG. 6, the frequency spectrum of the radar transmitter output, $RF_o$, is shown for a transmitter 7 comprising the present invention of a spurious frequency suppressor 10. Comparing the spectrum profile therein with the spectrum profile of FIG. 5, there is seen the significant degree of improvement by employing the present invention in which all off carrier frequency components are at least 80 dB below the level of the carrier.

This concludes the description of the preferred embodiment. However, many modifications and alterations will be obvious to one of ordinary skill in the art without departing from the spirit and scope of the inventive concept. For example, in some radar system applications more than one spurious frequency suppressor 10 may be employed in a cascaded chain of amplifier stages. Therefore, it is intended that the scope of this invention be limited only by the appended claims.

What is claimed is:

1. In combination:
  means for providing RF pulses;
  means for amplifying said RF pulses;
  means coupled between said RF pulses providing means and said RF amplifying means for suppressing spurious frequencies generated in said amplifying means while continuously generating RF pulses, said suppressing means comprising:
  a directional coupler having four ports, a first port being an input port and a second port being an output port;
  said input port of said directional coupler being provided with said RF pulses from said providing means;
  means coupled to a third port and a fourth port of said directional coupler for attenuating said RF pulses in accordance with a control signal; and
  means coupled to said attenuating means for generating said control signal.

2. The combination as recited in claim 1 wherein:
  said directional coupler comprises a 3 dB 90° hybrid.

3. The combination as recited in claim 1 wherein:
  said attenuating means comprises a PIN diode network means for controlling the amount of attenuation of said RF pulses in accordance with said control signal.

4. The combination as recited in claim 3 wherein:
  said PIN diode network means changes the fall time of said RF pulses in accordance with said control signal.

5. The combination as recited in claim 3 wherein:
  said control signal generating means comprises pulse shaping means for generating a bias current for said PIN diode network means.

6. The combination as recited in claim 5 wherein said pulse shaping means comprises:
  means for adjusting the pulse width of a trigger signal in response to a pretrigger input signal;
  means coupled to said adjusting means for generating a voltage ramp signal; and
  means coupled to said voltage ramp signal generating means for generating said bias current for said PIN diode network means.

7. A method of suppressing spurious frequencies in a transmitter comprising the steps of:
  providing a source of RF pulses;
  amplifying said RF pulses with a plurality of amplifier stages;
  suppressing said spurious frequencies generated in said amplifier stages by coupling a suppressing means between said source of RF pulses and said amplifier stages while continuously generating RF pulses, said suppressing step further comprises the steps of:
  providing said RF pulses to an input first port of a four port directional coupler with a second port being an output port;
  attenuating said RF pulses with means coupled to a third port and a fourth port of said directional coupler in accordance with a control signal; and
  generating said control signal with means coupled to said attenuating means.

8. The method as recited in claim 7 wherein said step of attenuating said RF pulses comprises the step of providing a PIN diode network means for controlling the amount of attenuation of said RF pulses in accordance with said control signal.

9. The method as recited in claim 8 wherein said step of providing said PIN diode network means for controlling the amount of attenuation further comprises the step of changing the fall time of said RF pulses in accordance with said control signal.

10. A transmitter comprising:
  predriver means for amplifying an RF input signal;
  means coupled to an output of said predriver means for suppressing spurious frequencies, said suppressing means comprises an RF attenuating means for generating a controlled RF OUT signal; and
  a plurality of amplifier stage means coupled to said suppressing means for amplifying said controlled RF OUT signal, said spurious frequencies being suppressed in accordance with said suppressing means preceding said plurality of amplifier while continuously generating said RF OUT signal stages.

11. A method of suppressing spurious frequencies in a transmitter comprising the steps of:
  amplifying an RF input signal with predriver means;
  suppressing spurious frequencies generated in said transmitter with means coupled to an output of said predriver means;
  generating a controlled RF OUT signal in said spurious frequencies suppressing means having an RF attenuating means; and
  amplifying said controlled RF OUT signal with a plurality of amplifier stage means coupled to said suppressing means, said spurious frequencies being suppressed in accordance with said suppressing means preceding said plurality of amplifier while continuously generating said RF OUT signal stages.

12. The transmitter as recited in claim 10 wherein:
  said spurious frequencies suppressing means comprises means for controlling the fall time of said controlled RF OUT signal.

13. The method as recited in claim 11 wherein said step of suppressing spurious frequencies comprises the step of controlling the fall time of said controlled RF OUT signal.

* * * * *